US008860100B2

(12) United States Patent
Kuwazawa

(10) Patent No.: US 8,860,100 B2
(45) Date of Patent: Oct. 14, 2014

(54) SOLID-STATE IMAGING DEVICE

(75) Inventor: Kazunobu Kuwazawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 305 days.

(21) Appl. No.: 13/311,051

(22) Filed: Dec. 5, 2011

(65) Prior Publication Data

US 2012/0146117 A1 Jun. 14, 2012

(30) Foreign Application Priority Data

Dec. 10, 2010 (JP) ................. 2010-275444

(51) Int. Cl.
*H01L 27/146* (2006.01)
(52) U.S. Cl.
CPC .... *H01L 27/14603* (2013.01); *H01L 27/14614* (2013.01); *H01L 27/14647* (2013.01); *H01L 27/14643* (2013.01); *H01L 27/14605* (2013.01); *H01L 27/14607* (2013.01); *H01L 27/14645* (2013.01); *H01L 27/14612* (2013.01)
USPC ............. 257/292; 257/72; 257/291; 257/440; 257/E27.131; 257/E27.132; 257/E27.133; 257/E27.134; 348/272; 348/280; 348/294; 348/302; 348/308
(58) Field of Classification Search
CPC .................. H01L 27/14645; H01L 27/14643; H01L 27/14647; H01L 27/14603; H01L 27/14605; H01L 27/14607; H01L 27/14612; H01L 27/14614
USPC .......... 257/290–292, 294, E27.129, E27.131, 257/E27.132, E27.133, E27.134, 72, 440; 348/272, 280, 294, 302, 308
See application file for complete search history.

(56) References Cited

U.S. PATENT DOCUMENTS

| 6,051,857 | A | 4/2000 | Miida |
| 6,448,596 | B1 | 9/2002 | Kawajiri et al. |
| 6,504,194 | B1 | 1/2003 | Miida |
| 6,512,547 | B1 | 1/2003 | Miida |
| 6,656,777 | B2 | 12/2003 | Miida |
| 6,677,627 | B2 | 1/2004 | Miida |
| 7,030,427 | B2 | 4/2006 | Takamura |
| 7,116,367 | B2 | 10/2006 | Shinohara |
| 7,436,010 | B2 | 10/2008 | Mori et al. |
| 7,663,680 | B2 * | 2/2010 | Hashimoto et al. ........... 348/301 |
| 7,671,912 | B2 | 3/2010 | Abe et al. |
| 2002/0024068 | A1 | 2/2002 | Shinohara |
| 2004/0159861 | A1 | 8/2004 | Mori et al. |

(Continued)

FOREIGN PATENT DOCUMENTS

| JP | B2-2935492 | 8/1999 |
| JP | B2-3315962 | 8/2002 |

(Continued)

*Primary Examiner* — Ermias Woldegeorgis
(74) *Attorney, Agent, or Firm* — Oliff PLC

(57) ABSTRACT

A solid-state imaging device includes: a first photodiode receiving light of a first color; a second photodiode that is arranged next to the first photodiode in a first direction and receives light of a second color; a third photodiode that is arranged next to the second photodiode in a second direction and receives light of the first color; a fourth photodiode that is arranged next to the third photodiode in the first direction and receives light of a third color; a first reset transistor for discharging a charge generated in the first photodiode and the second photodiode; and a second reset transistor for discharging a charge generated in the third photodiode and the fourth photodiode. The first photodiode and the third photodiode have a small difference in area.

5 Claims, 4 Drawing Sheets

(56) References Cited

U.S. PATENT DOCUMENTS

| | | |
|---|---|---|
| 2004/0217351 A1 | 11/2004 | Takamura |
| 2005/0087781 A1* | 4/2005 | Kuwazawa et al. ........... 257/291 |
| 2006/0001751 A1 | 1/2006 | Abe et al. |
| 2006/0158582 A1 | 7/2006 | Hwang |
| 2008/0284882 A1 | 11/2008 | Mori et al. |
| 2009/0002538 A1 | 1/2009 | Mori et al. |
| 2010/0066877 A1 | 3/2010 | Yamaguchi et al. |
| 2010/0110243 A1 | 5/2010 | Abe et al. |
| 2010/0110244 A1 | 5/2010 | Abe et al. |
| 2010/0140453 A1* | 6/2010 | Kikuchi ..................... 250/208.1 |
| 2010/0214454 A1 | 8/2010 | Kikuchi |
| 2012/0262609 A1 | 10/2012 | Kikuchi |

FOREIGN PATENT DOCUMENTS

| | | |
|---|---|---|
| JP | B2-3568885 | 9/2004 |
| JP | B2-3585219 | 11/2004 |
| JP | A-2006-191114 | 7/2006 |
| JP | A-2006-203034 | 8/2006 |
| JP | B2-3901114 | 4/2007 |
| JP | B2-3916612 | 5/2007 |
| JP | B2-3988189 | 10/2007 |
| JP | A-2008-210928 | 9/2008 |
| JP | B2-4457325 | 4/2010 |
| JP | B2-4457326 | 4/2010 |
| JP | A-2010-199668 | 9/2010 |
| JP | A-2010-129548 | 10/2010 |

* cited by examiner

SOLID-STATE IMAGING DEVICE

BACKGROUND

The entire disclosure of Japanese Patent Application No. 2010-275444, filed Dec. 10, 2010 is expressly incorporated by reference herein.

1. Technical Field

The present invention relates to solid-state imaging devices.

2. Related Art

It has been proposed to arrange a reset transistor for discharging electric charge generated at each transistor in a solid-state imaging device that is used as an imaging sensor (see, for example, Japanese Laid-open Patent Application 2008-210928).

However, arrangement of a reset transistor at each of the photodiodes would encroach on the area where the light-detecting section of each of the photodiodes can be arranged, such that a sufficient area cannot be secured for each of the photodiodes, which may lower the sensitivity. On the other hand, when a reset transistor is shared by a plurality of photodiodes, it is possible to suppress such reduction in the sensitivity. However, the areas where the light-detecting sections of the photodiodes can be arranged become unequal among the plurality of photodiodes, which may cause differences in the areas of photodiodes that receive light of the same color.

SUMMARY

The invention has been made in view of the technical difficulty described above. An aspect of embodiments of the invention relates to a solid-state imaging device having photodiodes, and pertains to an implementation of a reset transistor to be shared by two pixels, while suppressing the inconvenience associated with variations in the areas of the photodiodes in the solid-state imaging device.

In accordance with an aspect of an embodiment of the invention, a solid-state imaging device includes: a first photodiode receiving light of a first color, a second photodiode arranged next to the first photodiode in a first direction and receiving light of a second color, a third photodiode arranged next to the second photodiode in a second direction and receiving light of the first color, a fourth photodiode arranged next to the third photodiode in a first direction and receiving light of a third color, a first reset transistor for discharging a charge generated in the first photodiode and the second photodiode, and a second reset transistor for discharging a charge generated in the third photodiode and the fourth photodiode. In an aspect, a difference between the area of a light-receiving section of the first photodiode and the area of a light-receiving section of the third photodiode is smaller than a difference between the area of the light-receiving section of the first photodiode and the area of a light-receiving section of the second photodiode, and smaller than a difference between the area of the light-receiving section of the third photodiode and the area of a light-receiving section of the fourth photodiode. According to the aspect described above, while reducing a difference in the area between the first and third photodiodes corresponding to pixels of the same color, and allowing a difference in the area between the aforementioned photodiodes and the second and fourth photodiodes corresponding to pixels of different colors, each of the reset transistors can be shared by two pixels.

In the embodiment described above, the area of the light-receiving section of the first photodiode and the area of the light-receiving section of the third photodiode may preferably be the same. Accordingly, by forming the first and third photodiodes corresponding to the same color to have the same area, a difference in the characteristic of the photodiodes corresponding to the same color can be reduced.

In the embodiment described above, the light-receiving section of the first photodiode and the light-receiving section of the third photodiode may preferably have the same shape. Accordingly, by forming the first and third photodiodes corresponding to the same color to have the same shape, a difference in the characteristic of the photodiodes corresponding to the same color can be reduced.

In the embodiment described above, the area of the light-receiving section of the first photodiode may preferably be smaller than the area of the light-receiving section of the second photodiode, and the area of the light-receiving section of the third photodiode may preferably be smaller than the area of the light-receiving section of the fourth photodiode. Accordingly, the areas of the first and third photodiodes become relatively small, such that the gain to be applied to light detection signals from the second and fourth photodiodes can be made smaller.

In the embodiment, the first direction may preferably be perpendicular to the second direction. Also, in the embodiment described above, the light of the second color and the light of the third color may preferably be light of the same color.

In the embodiment described above, the solid-state imaging device may preferably further include a first modulation element that is provided adjacent to the first photodiode in a third direction, and outputs a modulation signal according to a charge generated in the first photodiode, a second modulation element that is provided adjacent to the second photodiode in the third direction, and outputs a modulation signal according to a charge generated in the second photodiode, a third modulation element that is provided adjacent to the third photodiode in the third direction, and outputs a modulation signal according to a charge generated in the third photodiode, and a fourth modulation element that is provided adjacent to the fourth photodiode in the third direction, and outputs a modulation signal according to a charge generated in the fourth photodiode. The first reset transistor may preferably be disposed between the first modulation element and the second modulation element, and the second reset transistor may preferably be disposed between the third modulation element and the fourth modulation element. Accordingly, the first reset transistor is disposed between the first modulation element and the second modulation element, and the second reset transistor is disposed between the third modulation element and the fourth modulation element, such that the positional relation of the first reset transistor with respect to the first photodiode and the positional relation of the second reset transistor with respect to the third photodiode can be matched each other. Accordingly, differences in the area and the shape between the first and third photodiodes corresponding to pixels of the same color can be reduced.

In the embodiment described above, the first reset transistor may preferably include a first gate electrode adjacent to the first modulation element, a second gate electrode adjacent to the second modulation element, and a first common drain section disposed between the first gate electrode and the second gate electrode. The second reset transistor may preferably include a third gate electrode adjacent to the third modulation element, a fourth gate electrode adjacent to the fourth modulation element, and a second common drain section disposed between the third gate electrode and the fourth gate electrode. Accordingly, as the reset transistors have the common drain section, the occupying area of the reset transistors can be made smaller, and the light detection area of the photodiode can be made greater, such that the light detection sensitivity can be increased.

In the embodiment described above, the solid-state imaging device may preferably further include a first light transmission section that transmits light of the first color toward the first photodiode, a second light transmission section that transmits light of the second color toward the second photodiode, a third light transmission section that transmits light of the first color toward the third photodiode, and a fourth light transmission section that transmits light of the third color toward the fourth photodiode, and the first through fourth light transmission sections may preferably have a Bayer arrangement.

DESCRIPTION OF EXEMPLARY EMBODIMENTS

An embodiment of the invention will be described in detail below. It is noted that the embodiment described below will not unduly limit the contents of the invention set forth in the scope of patent claims. Also, not all of the compositions described in the embodiment would necessarily be essential for the solution provided by the invention. Furthermore, the same components will be appended with the same reference numbers, and their description will not be repeated.

1. Structure of Embodiment

Figure 1:
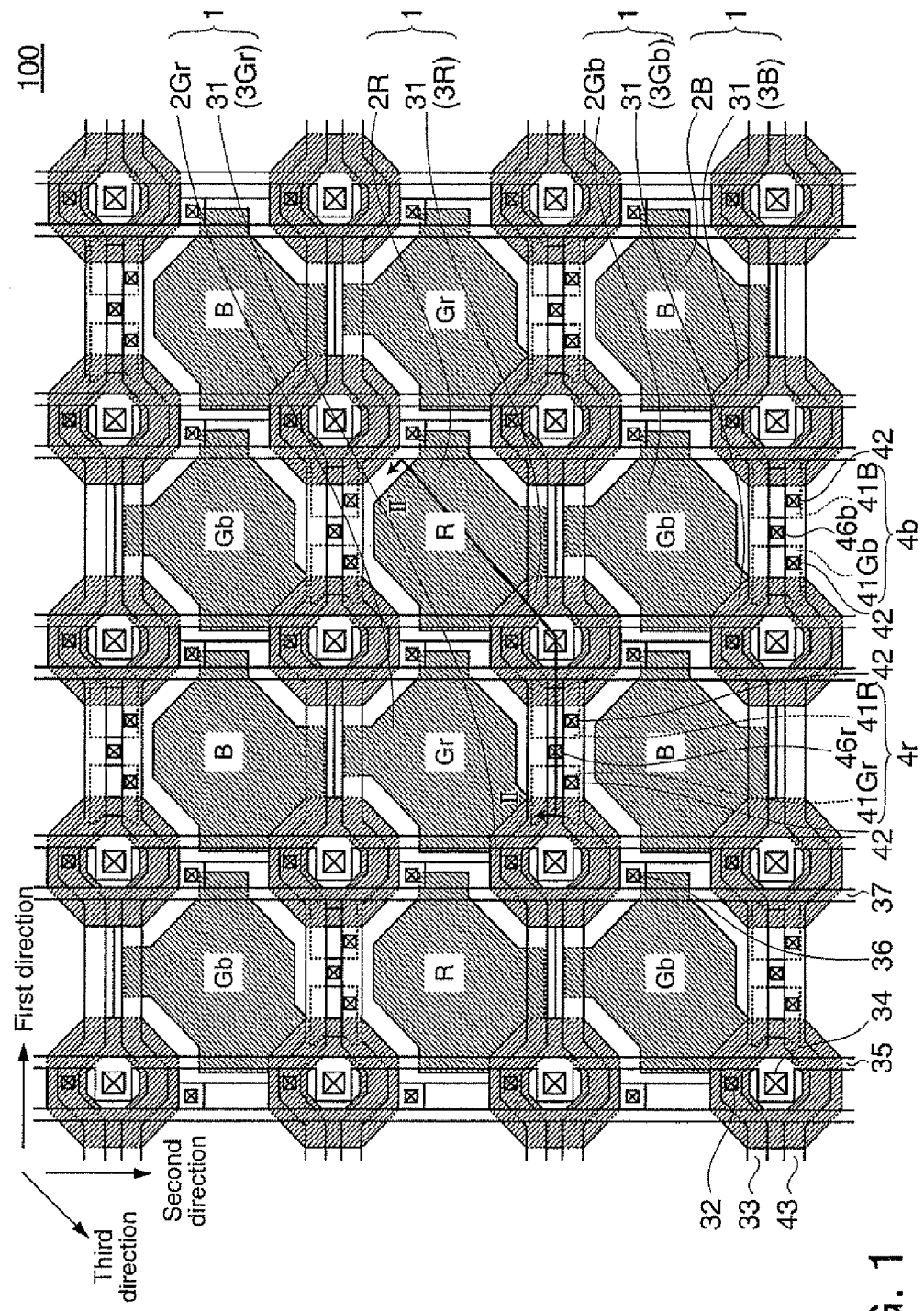
FIG. 1 is a plan view showing the structure of a solid-state imaging device in accordance with an embodiment of the invention.
Figure 2:
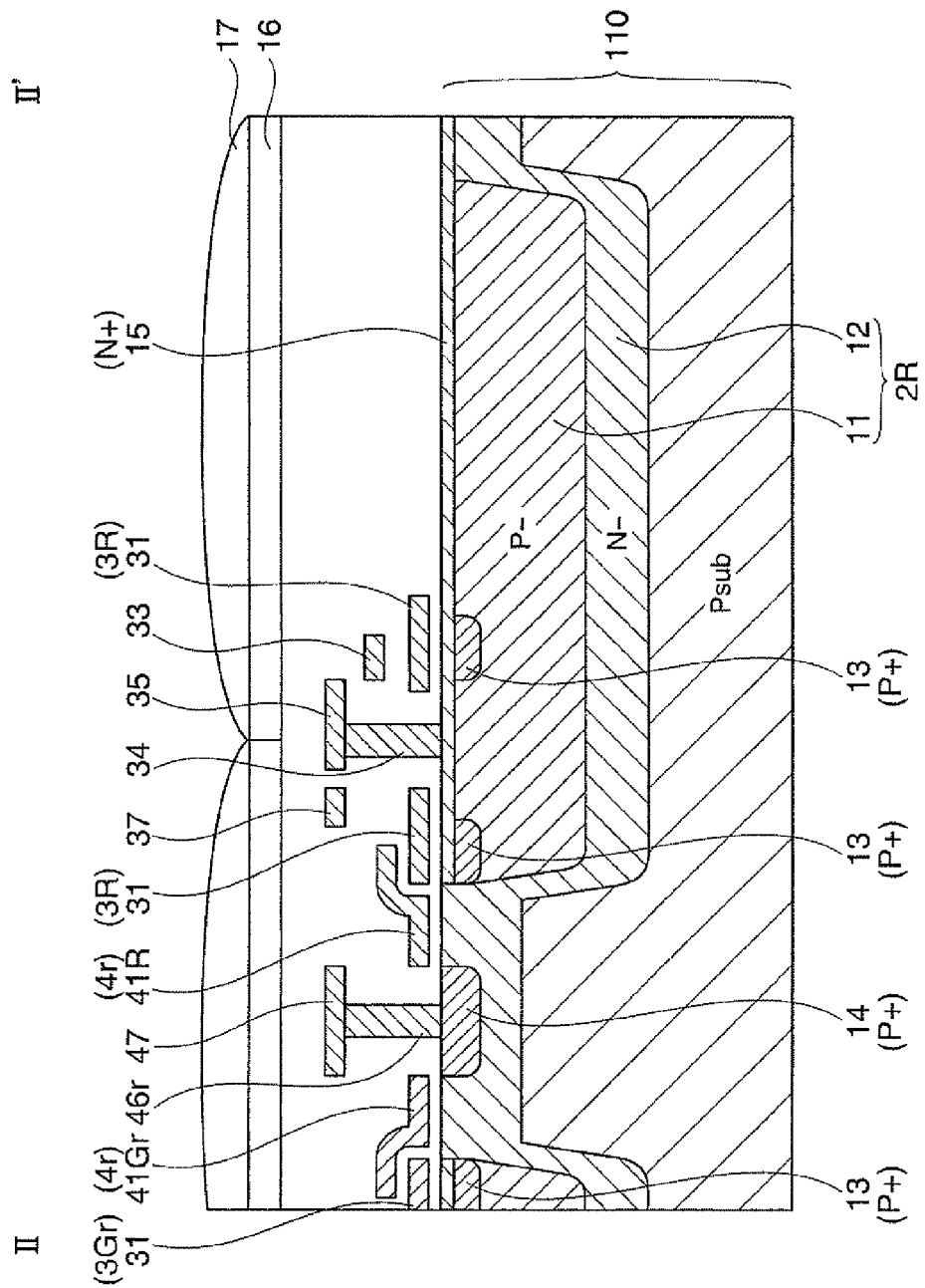
FIG. 2 is a cross-sectional view taken along a line II-II'.

FIG. 1 is a plan view showing the structure of a solid-state imaging device in accordance with an embodiment of the invention, and FIG. 2 is a cross-sectional view taken along a line II-II' of FIG. 1. As shown in FIG. 1, a solid-state imaging device 100 is configured with a plurality of solid-state imaging elements regularly arranged in a first direction (for example, in a rightward direction) and a second direction (for example, in a downward direction).

Each one of the solid-state imaging elements 1 includes one photodiode (2Gr, 2R, 2Gb, 2B) and one modulation element (3Gr, 3R, 3Gb, 3B). Each of the modulation elements (3Gr, 3R, 3Gb, 3B) has a gate electrode 31 in a ring shape to be described below. The gate electrode 31 is disposed in a manner not to overlap the photodiode (2Gr, 2R, 2Gb, 2B), and to allow the photodiode (2Gr, 2R, 2Gb, 2B) to be able to secure an area as large as possible. In FIG. 1, each of the gate electrodes 31 is disposed adjacent to each of the photodiodes (2Gr, 2R, 2Gb, 2B) in a third direction (for example, a diagonally leftward and downward direction), respectively.

As shown in FIG. 2, a color filter 16 and a micro lens array 17 are formed above various signal lines, such as, signal output lines 35 and the like to be described below. The micro lens array 17 includes regularly arranged convex lens. Each of the convex lenses is disposed opposite each of the photodiodes 2Gr, 2R, 2Gb, and 2B, respectively, and collects incident light onto each of the photodiodes 2Gr, 2R, 2Gb, and 2B, respectively.

The color filter 16 includes light-transmission sections of three colors, for example, as shown in FIG. 1, red (R), green (Gr or Gb) and blue (B), regularly arranged therein, and each of the light-transmission sections is disposed opposite each of the photodiodes (2Gr, 2R, 2Gb, 2B), respectively, and selects wavelengths of light incident on each of the photodiodes (2Gr, 2R, 2Gb, 2B), respectively. In the embodiment shown in FIG. 1, a red (R) pixel is disposed adjacent to and on the right of a green (Gr) pixel, a green (Gb) pixel is disposed adjacent to and below the red (R) pixel, and a blue (B) pixel is disposed adjacent to and on the right of the green (Gb) pixel. Such an arrangement of colors is called a Bayer arrangement. Here, Gr indicates a green pixel that is disposed in the same row as that of the red (R) pixel (on the right), and Gb indicates a green pixel disposed in the same row as that of the blue (B) (on the right). Also, when one pixel is disposed adjacent to another pixel, something other than pixels, such as, a pixel isolation region may be provided between the adjacent pixels.

1-1. Photodiode

As shown in FIG. 2, the photodiode 2R is formed in a semiconductor substrate 110, and the modulation element 3R is formed on the surface of the semiconductor substrate 110. The semiconductor substrate 110 is a substrate of a first conductivity type (for example, P type). It is noted that the substrate itself is not limited to the first conductivity type, but the substrate may be a semiconductor substrate of a second conductivity type (for example, N type), and a well of the first conductivity type may be formed at the surface side of the semiconductor substrate.

A semiconductor region 12 of the second conductivity type (for example, N type) is formed on the surface side of the semiconductor substrate 110 within the semiconductor substrate 110. Within the semiconductor region 12 of the second conductivity type, a semiconductor region 11 of the first conductivity type is formed on the surface side of the semiconductor substrate 110. The semiconductor region 11 of the first conductivity type and the semiconductor region 12 of the second conductivity type form the photodiode 2R.

A pinning layer 15 of the second conductivity type is formed at the topmost surface of the semiconductor substrate 110. The pinning layer 15 prevents generation of dark current at the substrate surface. It is noted that the description of the photodiode 2R above similarly applies to the photodiodes 2Gr, 2Gb and 2B.

1-2. Modulation Element

The modulation element 3R is a transistor including the gate electrode 31 formed through a dielectric film on the semiconductor substrate 110. The gate electrode 31 is formed in a ring shape as viewed in a plan view (see FIG. 1). The gate electrode 31 is connected to a modulation control line 33 through a gate contact 32.

On the surface of the semiconductor substrate 110, a source section is formed in a region surrounded by the gate electrode 31 as viewed in a plan view. The source section is connected to a signal output line 35 through a source contact 34 on the semiconductor substrate 110. Also, on the surface of the semiconductor substrate 110, a drain section is formed outside the gate electrode 31 as viewed in a plan view. The drain section is connected to a drain line 37 through a drain contact 36 (see FIG. 1) on the semiconductor substrate 110.

The semiconductor region 11 of the first conductivity type and the semiconductor region 12 of the second conductivity type of the photodiode 2R extend into a region immediately below the modulation element 3R of the semiconductor substrate 110. Charge (for example, holes) generated in the photodiode 2R that has received light is stored in a carrier pocket 13 that is a high concentration first conductivity semiconductor region formed in a region immediately below the modulation element 3R of the semiconductor region 11 of the first conductivity type. Due to the charge accumulation, a substrate bias is applied to the modulation element 3R, causing the threshold voltage of the modulation element 3R to change. The amount of the change in the threshold voltage is detected as the amount of incident light. It is noted that the description of the modulation element 3R made above similarly applies to the modulation elements 3Gr, 3Gb and 3B.

1-3. Reset Transistor

As shown in FIG. 1, a reset transistor 4r is disposed between the modulation element 3Gr and the modulation element 3R, and a reset transistor 4b is disposed between the modulation element 3Gb and the modulation element 3B.

As shown in FIG. 2, the reset transistor 4r is a transistor that includes two gate electrodes 41Gr and 41R formed through a dielectric film on the semiconductor region 12 of the second conductivity type of the semiconductor substrate 110. The gate electrodes 41Gr and 41R extend, at both ends of the reset transistor 4r, over the gate electrodes 31 of the modulation elements 3Gr and 3R through a dielectric film, respectively. The gate electrodes 41Gr and 41R are connected to a common reset control line 43 (see FIG. 1) through the gate contacts 42 (see FIG. 1).

A common drain section 14 that is a high concentration first conductivity type semiconductor region is formed in the surface of the semiconductor substrate 110 between the gate electrodes 41Gr and 41R. The common drain section 14 is connected to a drain line 47 through a common drain contact 46r on the semiconductor substrate 110. After the amount of incident light has been detected by the modulation elements 3Gr and 3R, a voltage greater than the threshold value is applied to the gate electrodes 41Gr and 41R, whereby channels are formed in regions immediately below the gate electrodes 41Gr and 41R of the semiconductor substrate 110, and the charge stored in the carrier pocket 13 is discharged to the drain section 14. It is noted that the description of the reset transistor 4r made above similarly applies to the reset transistor 4b.

1-4. Arrangement of Reset Transistor

In accordance with the present embodiment, the drain section 14 of the reset transistor 4r and the drain contact 46r are shared by two solid-state imaging elements 1 that are arranged adjacent to each other in the first direction (for example, the rightward direction), and the reset transistor 4r is positioned between the two modulation elements 3Gr and 3R that are arranged adjacent to each other in the first direction, Accordingly, in the present embodiment, the occupying area of the reset transistor 4r is reduced, compared to the case where the reset transistor 4r is provided for each one of the modulation elements, such that the light receiving areas of the photodiodes 2Gr, 2R, 2Gb and 2B can be increased, and thus the light detecting sensitivity can be improved.

Similarly, the drain section 14 of the reset transistor 4b and the drain contact 46b are shared by two solid-state imaging elements 1 that are arranged adjacent to each other in the first direction (for example, the rightward direction), and the reset transistor 4b is positioned between the two modulation elements 3Gb and 3B that are arranged adjacent to each other in the first direction. Accordingly, the light receiving areas of the photodiodes 2Gr, 2R, 2Gb and 2B can be increased, and thus the light detecting sensitivity can be improved.

Further, in accordance with the present embodiment, the reset transistors 4r and 4b are arranged at an interval of one photodiode in the second direction (for example, the downward direction) at positions shifted by one photodiode in the first direction (for example, the rightward direction). In the example shown in FIG. 1, each of the reset transistors 4r and 4b is always provided adjacent to a green (Gr or Gb) pixel downward in the second direction as viewed from the green pixel (on the opposite side to the second direction as viewed from a red (R) or a blue (B) pixel). According to the above, the photodiodes 2Gr and 2Gb corresponding to green (Gr or Gb) pixels can be formed in the same area and the same shape. In this manner, by reducing differences in the area and the shape between the photodiodes 2Gr and 2Gb corresponding to pixels of the same color, characteristic differences among pixels of the same color can be made smaller.

In accordance with the present embodiment, the area and the shape of the photodiodes 2R and 2B corresponding to red (R) and blue (B) pixels are different from the area and the shape of the photodiodes 2Gr and 2Gb corresponding to green (Gr or Gb) pixels. However, for different colors, characteristic differences can be corrected (their spectral sensitivity can be adjusted) through signal processing in a succeeding stage.

Rather, the area of each of the photodiodes 2R and 2B corresponding to red (R) and blue (B) pixels may preferably be greater than the area of each of the photodiodes 2Gr and 2Gb corresponding to green (Gr or Gb) pixels. If these photodiodes have the same area, a specified amount of gain needs to be applied to light detection signals of the solid-state imaging elements corresponding to red (R) and blue (B) pixels to correct them in order to make their spectral sensitivity characteristics uniform in the visible light range. When the areas of the photodiodes 2R and 2B corresponding to red (R) and blue (B) pixels are made greater, such a gain can be smaller. Accordingly, making the area of each of the photodiodes 2R and 2B corresponding to red (R) and blue (B) pixels larger, the degree of freedom in correction can be made greater. In the example shown in FIG. 1, the area of each of the photodiodes 2R and 2B corresponding to red (R) and blue (B) pixels is slightly larger than the area of each of the photodiodes 2Gr and 2Gb corresponding to green (Gr or Gb) pixels.

1-5, Other Embodiments

In the embodiment described above, an example in which the first direction and the second direction traverse each other at the right angle is shown. However, the first direction and the second direction may traverse each other at an angle other than the right angle. However, if the first direction and the second direction are in parallel with each other, photodiodes cannot be disposed on a plane. Therefore, the first direction and the second direction may preferably extend in directions that traverse each other and, more preferably, may extend in directions that traverse each other in the range between 50 degrees and 130 degrees.

In the embodiment described above, the first direction and the third direction may traverse each other at 45 degrees, as an example. However, the first direction and the third direction may traverse each other at an angle other than 45 degrees. However, when the first direction and the third direction are in parallel with each other, restrictions in layout increase when a reset transistor is shared by two adjacent photodiodes arranged in the first direction. Therefore, the first direction and the third direction may preferably extend in directions that traverse each other and, more preferably, may extend in direction that traverse in the range between 30 degrees and 150 degrees.

Also, the solid-state imaging element in accordance with the embodiment described above is a so-called substrate modulation type solid-state imaging element, which detects changes in the threshold voltages of the modulation elements 3Gr, 3R, 3Gb and 3B based on charges accumulated in the semiconductor substrate 110, but may use other modulation methods or detection methods, and may be, for example, a CMOS (Complementary Metal Oxide Semiconductor) image sensor.

Also, in the example shown in the above-described embodiment, the color filter 16 and the micro lens array 17 are formed on the front surface side of the semiconductor substrate 110. However, without any particular limitation to the above, the color filter 16 and the micro lens array 17 may be formed on the rear surface side of the semiconductor substrate 110, so as to receive light at the rear surface side.

2. Comparison Example

Figure 3:
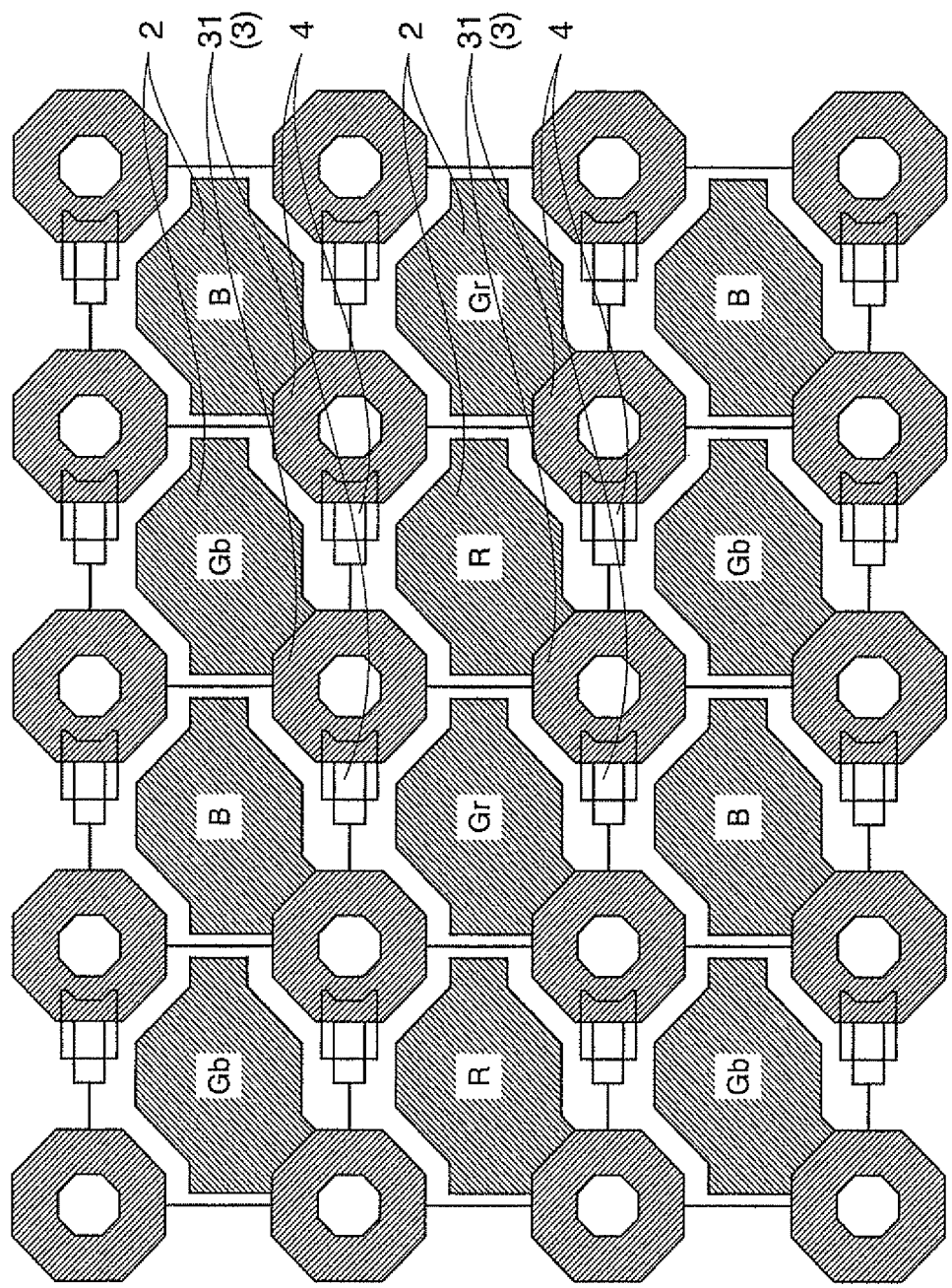
FIG. 3 is a plan view showing the structure of a solid-state imaging device in accordance with a first comparison example.

FIG. 3 is a plan view showing the structure of a solid-state imaging device in accordance with a first comparison example. As shown in FIG. 3, a reset transistor 4 is disposed at each set of one photodiode 2 and one modulation element 3. Such an arrangement would make the area of the light detection section of the photodiode 2 in the solid-state imaging device smaller, and therefore its sensitivity would be lowered.

Figure 4:
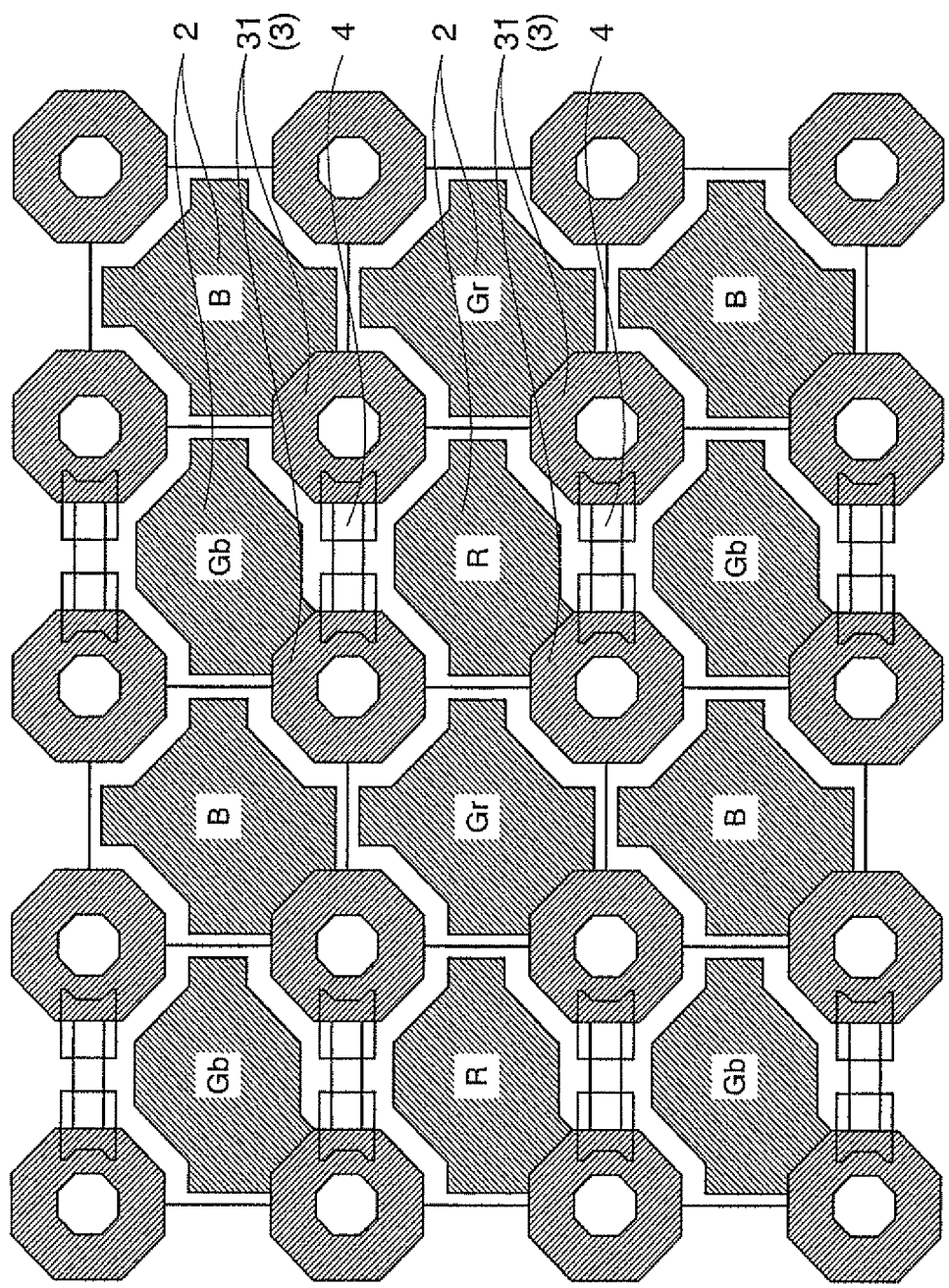
FIG. 4 is a plan view showing the structure of a solid-state imaging device in accordance with a second comparison example.

FIG. 4 is a plan view showing the structure of a solid-state imaging device in accordance with a second comparison example. As shown in FIG. 4, a reset transistor 4 is disposed at each set of two photodiodes 2 and two modulation elements 3, and each one reset transistor 4 is shared by two solid-state imaging elements. According to such an arrangement, compared to the structure shown in FIG. 3, the area of the photodiode 2 corresponding to a blue (B) pixel and the area of the photodiode 2 corresponding to a green (Or) pixel arranged in the same row of red (R) pixels become greater.

However, the area and the shape of the photodiode 2 corresponding to a green (Gb) pixel arranged in the same row of blue (B) pixels are different from the area and the shape of the photodiode 2 corresponding to a green (Gr) pixel arranged in the same row of red (R) pixels. According to such a structure, characteristic differences are generated among the photodiodes of the same color (green), such that defects, such as, streaks appearing in an image would occur.

In contrast, according to the embodiment of the invention described with reference to FIG. 1 and FIG. 2, the reset transistors 4r and 4b are arranged at an interval of one photodiode in the second direction (for example, the downward direction) at positions shifted by one photodiode in the first direction (for example, the rightward direction). Therefore, in accordance with the present embodiment of the invention, the photodiodes 2Gr and 2Gb corresponding to green (Gr or Gb) pixels can be formed in the same area and the same shape.

What is claimed is:

1. A solid-state imaging device comprising:
   a first photodiode that receives light of a first color;
   a second photodiode that is arranged next to the first photodiode in a first direction and receives light of a second color;
   a third photodiode that is arranged next to the second photodiode in a second direction and receives light of the first color;
   a fourth photodiode that is arranged next to the third photodiode in the first direction and receives light of a third color;
   a first reset transistor discharging a charge generated in the first photodiode and the second photodiode;
   a second reset transistor discharging a charge generated in the third photodiode and the fourth photodiode,
   a difference between an area of a light-receiving section of the first photodiode and an area of a light-receiving section of the third photodiode being smaller than a difference between the area of the light-receiving section of the first photodiode and an area of a light-receiving section of the second photodiode, the difference being smaller than a difference between the area of the light-receiving section of the third photodiode and an area of a light-receiving section of the fourth photodiode,
      wherein the area of the light-receiving section of the first photodiode and the area of the light-receiving section of the third photodiode are identical to each other, and
   a first modulation element that is provided adjacent to the first photodiode in a third direction and outputs a modulation signal according to a charge generated in the first photodiode,
   a second modulation element that is provided adjacent to the second photodiode in the third direction, and outputs a modulation signal according to a charge generated in the second photodiode,
   a third modulation element that is provided adjacent to the third photodiode in the third direction, and outputs a modulation signal according to a charge generated in the third photodiode,
   a fourth modulation element that is provided adjacent to the fourth photodiode in the third direction, and outputs a modulation signal according to a charge generated in the fourth photodiode,
   the first reset transistor being disposed between the first modulation element and the second modulation element,
   the second reset transistor being disposed between the third modulation element and the fourth modulation element,
   wherein
   the first reset transistor includes
      a first gate electrode adjacent to the first modulation element,
      a second gate electrode adjacent to the second modulation element, and
      a first common drain section disposed between the first gate electrode and the second gate electrode, and
   the second reset transistor includes
      a third gate electrode adjacent to the third modulation element,
      a fourth gate electrode adjacent to the fourth modulation element, and
      a second common drain section disposed between the third gate electrode and the fourth gate electrode.

2. A solid-state imaging device according to claim 1, wherein the light-receiving section of the first photodiode and the light-receiving section of the third photodiode generally have an identical shape.

3. A solid-state imaging device according to claim 1, wherein the area of the light-receiving section of the first photodiode is smaller than the area of the light-receiving section of the second photodiode, and the area of the light-receiving section of the third photodiode is smaller than the area of the light-receiving section of the fourth photodiode.

4. A solid-state imaging device according to claim 1, wherein the first direction is perpendicular to the second direction.

5. A solid-state imaging device according to claim 1, further comprising:
- a first light transmission section that transmits light of the first color toward the first photodiode,
- a second light transmission section that transmits light of the second color toward the second photodiode,
- a third light transmission section that transmits light of the first color toward the third photodiode, and
- a fourth light transmission section that transmits light of the third color toward the fourth photodiode,
- the first through fourth light transmission sections having a Bayer arrangement.

* * * * *